United States Patent
Chivukula et al.

[11] Patent Number: 5,886,867
[45] Date of Patent: Mar. 23, 1999

[54] FERROELECTRIC DIELECTRIC FOR INTEGRATED CIRCUIT APPLICATIONS AT MICROWAVE FREQUENCIES

[75] Inventors: Vasanta Chivukula, Nepean, Canada; Pak K. Leung, Gilbert, Ariz.

[73] Assignee: Northern Telecom Limited, Ottawa, Canada

[21] Appl. No.: 814,627

[22] Filed: Mar. 10, 1997

Related U.S. Application Data

[63] Continuation of Ser. No. 410,605, Mar. 21, 1995, abandoned.

[51] Int. Cl.$^6$ .............................. H01G 4/06; H01L 29/76
[52] U.S. Cl. ................. 361/311; 361/321.1; 361/321.5; 257/295
[58] Field of Search .............................. 361/321.1–321.5, 361/311, 312; 257/295, 301–305, 296, 306, 310; 365/145, 149

[56] References Cited

U.S. PATENT DOCUMENTS

| | | | |
|---|---|---|---|
| 5,206,788 | 4/1993 | Larson et al. | 361/313 |
| 5,330,931 | 7/1994 | Emesh et al. | 437/60 |

FOREIGN PATENT DOCUMENTS 4112412  4/1992  Japan .

OTHER PUBLICATIONS

Croteau et al., Growth and Characterisation of Pb(Zr,Ti)O3 Films Deposited by Reactive Sputtering of Metallic Target, ISAF, Jun. 1986.

Seshu B. Desu et al., "Size Effects in Sputtered PZT Thin Films", Mat. Res. Soc. Symp. Proc. vol. 200, 1990 Materials Research Society, pp. 319–324.

K. Sreenivas et al., "Characterization of Lead Zirconate Titanate (PZT)—Indium Tin Oxide (ITO) Thin Film Interface", Mat. Res. Soc. Symp. Proc. vol. 200, 1990 Materials Research Society, pp. 255–260.

André Croteau et al., "Growth and Characterisation of Pb(Zr,Ti)O$_3$ Films Deposited by Reactive Sputtering of Metallic Targets", Proceedings of the Sixth IEEE International Symposium on Applications Ferroelectrics, Jun. 8–11, 1986, pp. 606–609.

(List continued on next page.)

*Primary Examiner*—Kristine Kincaid
*Assistant Examiner*—Anthony Dinkins
*Attorney, Agent, or Firm*—Foley & Lardner

[57] ABSTRACT

A ferroelectric dielectric for microwave applications is provided including a polycrystalline perovskite phase of lead zirconate titanate dielectric material. Small grain size material is provided by a low temperature process, by a rapid thermal annealing process. A layer of amorphous ferroelectric precursor material is deposited and annealed in an oxygen containing atmosphere in the presence of water vapour, preferably with the addition of a few percent of ozone, and at a temperature of less than 500° C. Advantageously, the method provides for formation of a ferroelectric material including lead zirconate titanate with a grain size less than 20 nm, with low film stress, high dielectric constant and low leakage current, which has excellent ferroelectric characteristics up to 10 GHz. This material has applications for capacitors, as filters, decoupling, coupling, and bypass elements and also for high frequency surface acoustic wave devices.

11 Claims, 9 Drawing Sheets

OTHER PUBLICATIONS

R. Ramesh et al., "Ferroelectric PbZr$_{0.2}$Ti$_{0.8}$O3 Thin Films on Epitaxial Y–Ba–Cu–O", Proceedings 3rd International Symposium on Integrated Ferroelectrics, Apr. 3–5, 1991, pp. 54–61.

J.F. Scott et al., "A Model of Voltage–Dependent Dielectric Losses for Ferroelectric MMIC Devices", *Integrated Ferroelectrics*, 1995, vol. 6, pp. 189–203.

M. Sayer et al., "Integrated Piezoelectric and Pyroelectric Devices From Thin Film Ferroelectrics", Mat. Res. Soc. Symp. Proc. vol. 243, 1992 Materials Research Society, pp. 39–48.

J.F. Scott et al., "Loss mechanisms in fine–grained ferroelectric ceramic thin films for ULSI memories (DRAMs)", J. of Alloys and Compounds, 10th International Conference on Internal Friction and Ultrasonic Attenuation in Solids, 1993.

Journal of Alloys and Compounds, vol. 211, Sep. 1994, pp. 451–454, J.F. Scott et al. Loss mechanisms in fine–grained ferroelectric ceramic thin films for ULSI memories (DRAMs).

Patent Abstracts of Japan, vol. 016, No. 354 (E–1242), 30 Jul. 1992 & JP,A,04 112412 (Tosoh Corp) 14 Apr. 1992.

"Ferroelectric and Piezoelectric Films", Sayer et al, Introduction to Ferroelectronics, Handbook of Thin Film Technology, Ch. E4.0, I.O.P. Publishing, May 1995.

"GaAs Microwave–Monolithic ICs with Ferroelectric Capacitors", Ueda et al, IEEE Tokyo Sesction, Denshi Tokyo No. 32 (1003), pp. 100–103.

"Twinning in Ferroelectric and Ferroelastic Ceramics: Stress Relief", Arlt, G., J. Materials Science 25, p. 2655 (1990).

"Forces Translation Vibrations of 90° Domain Walls and the Dielectric Dispersion in Ferroelectric Ceramics", Pertsev et al, J. Appl. Phys. 74(6), 15 Sep. 1993, pp. 4105–4112.

"Dielectric Constant of Lead Titanate Zirconate Ceramics at High Frequency", Gerson et al, Journal of Applied Physics, vol. 34, No. 11, Nov. 1963, pp. 3242–3245.

FERROELECTRIC DIELECTRIC FOR INTEGRATED CIRCUIT APPLICATIONS AT MICROWAVE FREQUENCIES

This application is a continuation of application Ser. No. 08/410,605, filed Mar 21, 1995, now abandoned.

FIELD OF THE INVENTION

This invention relates to a ferroelectric dielectric for integrated circuit applications at microwave frequencies, and with particular application to ferroelectric capacitors and memory cells.

BACKGROUND OF THE INVENTION

In recent years, the use of the ferroelectric materials for random access memory (RAM) elements has reached commercial applications in the semiconductor industry. Ferroelectric dielectrics typically have very high dielectric constants ~500, which make these materials attractive as dielectrics for capacitors with high charge storage capacity. Ferroelectric memory elements are non-volatile, and programmable with low voltage, e.g. less than 5V. Other advantages include fast access times (<40 ns), and robustness with respect to virtually unlimited numbers of read and write cycles. These memory elements also consume low power, are dense and exhibit radiation hardness.

Ferroelectric materials which have allowed this breakthrough in integrated circuit applications include perovskite structure ferroelectric dielectric compounds, for example, lead zirconate titanate $PbZr_xTi_{1-x}O_3$ (PZT), barium titanate (BT), and barium strontium titanate (BST).

Chapter E4.0 "Introduction to Ferroelectrics" co-authored by one of the present inventors, provides a general review of ferroelectrics, to be published in Handbook of thin film Technology (IOP Publishing, May 1995)

Much work has been devoted to developing low temperature processes for formation of thin films of ferroelectric dielectrics compatible with semiconductor processing for CMOS, bipolar and bipolar CMOS technologies. Integration of ferroelectric materials with monolithic integrated circuits brings challenges including the selection of compatible materials for bottom and top electrodes, and for barrier layers and capping layers, to avoid or control contamination problems. These issues are discussed in more detail, for example, in U.S. Pat. No. 5,330,931 "Method of making a capacitor for an integrated circuit" to Emesh et al. issued 19 Jul. 1994, and copending U.S. patent applications Ser. No. 08-348849 filed 28 Nov. 1994, to Leung and Emesh, entitled "Capacitor for Integrated circuit", and Ser. No. 08-348848 filed 28 Nov. 1994 to Emesh, McDonald and Chivukala, entitled "Method of forming crystalline ferroelectric dielectric material for an integrated circuit."

While conventional dielectrics such as silicon dioxide, silicon nitride and silicon oxynitride have functional characteristics which are substantially independent of frequency up to at least 10 GHz, the relatively low value of the dielectric constant ($\epsilon \leq 10$) limits the capacitance attainable to about 2 to 3 $fF/\mu m^2$. On the other hand, the dielectric constant of ferroelectric dielectrics (typically $\epsilon$>500) allows for capacitances greater than 30 $fF/\mu m^2$. Consequently there is much interest in ferroelectric dielectric materials for small area capacitors, and for larger, high value capacitors. A number of applications require large on chip capacitances in the nF range. Ferroelectric dielectrics are of interest for applications as filter elements operating at low frequency (<100 Hz) to GHz frequencies, and as coupling and decoupling capacitors. On the other hand, it is known that a relaxation mechanism causes the dielectric constant of many ferroelectric materials to decrease significantly to a low value at microwave frequencies.

Thus, for high frequency applications in the microwave (GHz) frequency range, barium strontium titanate (BST) is a preferred material. For example, Ueda et al. of Matsushita, in a publication IEEE Tokyo Section, Denshi Tokyo No. 32 (1993), presented results for GaAs based Microwave monolithic ICs (MMICs) comprising BST having a dielectric constant of about 300 formed by a sol-gel method, showing that BST has a flat dielectric response up to about 5 GHz, when fabricated at a temperature of 600° C. The dielectric constant was increased to about 300 by annealing at higher temperature, ~800° C., but the frequency characteristic degraded significantly.

In a presentation by Gota Kano, of Matsushita Electronics Corp, and collaborators at the University of Colorado and Symetrix, at the International Symposium on Integrated ferroelectrics, Monterey, Mar. 9–11, 1992, the high frequency performance of thin films of several dielectric materials was compared. They reported that thin films of PZT, which in bulk ceramic form has a very high dielectric constant of about 1000, exhibits relaxation at much lower frequencies than BST, and beyond 100 MHz the dielectric constant of PZT drops to a very low value <10. They concluded that this material was not useful as a capacitor material at high frequencies. Consequently manufacturers have focussed on other ferroelectrics, particularly BST, for high frequency applications. Nevertheless, at low frequencies, BST has a lower dielectric constant that PZT, and BST typically requires higher processing temperatures.

SUMMARY OF THE INVENTION

Thus, the present invention seeks to provide a ferroelectric dielectric for an integrated circuit which avoids or reduces the above mentioned problems, with particular application to formation of ferroelectric capacitors for applications at microwave frequencies.

Thus according to one aspect of the present invention there is provided a ferroelectric dielectric for an integrated circuit operable at microwave frequencies above 1 GHz comprising fine grained polycrystalline lead zirconate titanate.

Thus lead zirconate titanate ferroelectric material was provided having improved high frequency characteristics. The material was provided having functional performance in the microwave frequency range of 1 to several GHz, which was comparable with other known high frequency ferroelectrics, e.g. BST.

The grain size of the polycrytalline PZT significantly influenced the frequency response. A fine grain structure polycrystalline material with grain sizes <<1 $\mu$m providing improved high frequency response relative to that of bulk films where the grain size is typically greater than ~10 $\mu$m. The useful upper limit to the grain size required to obtain microwave frequency response is discussed below.

Thin films of thicknesses from 50 nm to several microns were examined. In materials showing good high frequency characteristics over 1 GHz, preferably the grain size was substantially uniform, and less than 20 nm, and predominantly in the range from 10 nm to 15 nm. Thus polycrystalline PZT thin films were provided which showed no relaxation up to at least 10 GHz, and having a frequency and temperature dependence of the dielectric constant of less than 10%. The lead zirconate titanate may be doped with e.g.

lanthanum or niobium. Alternatively other dopants including tantalum and chromium may be used without reducing the high frequency response.

In preparing PZT films having high frequency performance above 1 GHz, a low temperature method was employed, for example a sol-gel process, comprising annealing, by rapid thermal processing, in an oxygen and ozone containing atmosphere, and preferably in the presence of water vapour. In addition to providing PZT films with high dielectric constant >300 and low film stress, it was discovered that the frequency response of the PZT was extended into the GHz range relative to the roll-off in dielectric constant which occurs at about 100 MHz in bulk ceramic PZT. Consequently, the usefulness of this material as a ferroelectric dielectric, is extended for use, e.g. for capacitors for integrated circuits operable at microwave frequencies. In other applications, these fine grained polycrystalline PZT may be used for high frequency surface acoustic wave (SAW) devices having low mechanical loss.

The grain size of the material appears to be a significant factor affecting high frequency response. While the effect of grain size are not fully understood, varying the composition of the sol-gel precursor, doping, and anneal conditions below 650° C. did not significantly effect the functional characteristics of the material. Annealing in oxygen and water vapour, or oxygen, ozone and water vapour improves the dielectric constant of the material, and reduce film stress, but did not significantly effect the roll-off frequency. Hence it is believed that in the range of preparation conditions investigated, the relatively low temperature process results in restricted grain growth, and is conducive to reproducibly forming fine grain PZT. The use of rapid thermal processing, rather than conventional furnace annealing, may be significant. Typically transmission electron microscope (TEM) photographs showed that the grain size was <20 nm and substantially uniform in size; grain sizes predominantly in the range 10 to 15 nm were preferred to obtain high frequency performance up to 10 GHz.

It is believed that other low temperature methods of forming PZT and doped PZT, for example by CVD, MOCVD, laser ablation, ion beam sputtering, may also be used to provide high frequency ferroelectric PZT material having small grain size PZT, having a roll off frequency exceeding 1 GHz. In defining fine grained in this context, while small grain sizes ~10 nm are preferred, grain sizes above 20 nm can be expected to provided improved response in the high frequency region compared to bulk PZT. The upper limit to the useful grain size to obtain a roll off frequency above 1 GHz is likely to be less than 1 $\mu$m, but substrate clamping in thin films, discussed below, may significantly affect the dielectric dispersion relative to bulk samples. In thin films, extra clamping effects from the substrate may extend the useful grain size to ~1 $\mu$m or beyond.

According to another aspect of the present invention there is provided a capacitor structure for an integrated circuit operable at microwave frequencies above 1 GHz and comprising first and second electrodes and an intervening layer of a ferroelectric capacitor dielectric material, the capacitor dielectric being selected from doped and undoped fine grained polycrystalline lead zirconate titanate, zirconium titanate and lead titanate. Preferably the dielectric is characterised by fine grain structure, having grain sizes less than 20 nm. Advantageously substantially uniform grain sizes in the range 10 to 15 nm provides a material having good functional characteristics up to at least several GHz, and a dielectric constant above 300.

According to a further aspect of the present invention there is provided a method of forming a ferroelectric dielectric comprising polycrystalline lead zironate titanate operable at microwave frequencies above 1 GHz, the method comprising: depositing a layer of amorphous ferroelectric precursor material comprising a mixture of lead, zirconium and titanium compounds on an integrated circuit substrate; and then, annealing the layer of amorphous ferroelectric precursor material at a temperature sufficient to cause a phase transformation to a ferroelectric polycrystalline perovskite phase, the annealing step comprising heating in an oxygen containing atmosphere in the presence of water vapour to provide a ferroelectric layer of lead zirconate titanate characterized by a fine grained structure.

Annealing is carried out by rapid thermal processing at between 450° C. and 650° C., and preferably at about 500° C., using rapid thermal processing. A wide range of composition from about 20:80 to 80:20 zirconium to titanium ratio was found to produce microwave dielectrics, and the composition was preferably 60:40. Dopants, including lanthanum or niobium may be added to the PZT precursor if required and do not significantly affect the microwave performance. Annealing is beneficially carried out by rapid thermal processing, in an atmosphere comprising oxygen and ozone, and in the presence water vapour. Under these conditions grain growth above about 20 nm was not observed. Significant correlation of the functional characteristics of PZT and other process parameters was not observed. That is, variation of the process parameters within these ranges changed shifted the value of the dielectric constant, but did not change the frequency response and roll-off frequency of the curve.

According to yet another aspect of the present invention there is provided a method of forming an integrated circuit structure comprising a ferroelectric capacitor structure operable at microwave frequencies above 1 GHz, the method comprising:

providing a substrate and providing thereon a first capacitor electrode;

providing on the electrode a layer of polycrystalline perovskite ferroelectric capacitor dielectric material, by steps comprising:

depositing a layer of amorphous ferroelectric precursor material, and annealing the layer of amorphous ferroelectric precursor material at a temperature sufficient to cause a phase transformation to a ferroelectric fine grained polycrystalline perovskite phase, the annealing step comprising heating in an oxygen containing atmosphere in the presence of water vapour, and providing a second capacitor electrode thereon.

Thus the present invention provides a ferroelectric dielectric material, a ferroelectric capacitor for an integrated circuit structure, and a method of formation thereof, which overcome or reduce some of the above mentioned problems.

BRIEF DESCRIPTION OF THE DRAWINGS

Embodiments of the invention will now be described by way of example, with reference to the accompanying drawing, in which.

DESCRIPTION OF THE PREFERRED EMBODIMENTS

In a method of forming a ferroelectric dielectric for a capacitor structure according to a first embodiment of the present invention, a ferroelectric capacitor structure was formed on an integrated circuit substrate comprising a semiconductor silicon wafer. A bottom electrode of a capacitor was defined on the substrate. The bottom electrode comprises a single conductive layer, or alternatively comprises a multilayer structure including a barrier layer and an adhesion layer. In the present example a bottom electrode was formed from sputtered platinum. A layer of lead zirconate titanate (PZT) was then formed on the bottom electrode as described in the above mentioned copending U.S. patent application Ser No. 08-348848, using a known spin-on liquid process to apply to the substrate a metallorganic sol-gel precursor comprising constituents of the ferroelectric material, i.e. an inorganic lead compound, and zirconium and titanium alkoxides in the desired proportions, e.g. to provide a 40:60 ratio of zirconium to titanium. A layer of the required thickness was obtained by sequentially depositing and heat treating several thin layers. Each layer of as-deposited material was heat treated at low temperature, i.e. below ≦450° C. for about 90 seconds, to drive off volatile organic components and to form an amorphous layer. The resulting amorphous layer was then annealed by a rapid thermal annealing (RTA) process at 450° C. or higher, in an annealing atmosphere comprising oxygen, preferably in the presence of water vapour, for 300 seconds. Water vapour was conveniently introduced into the annealing atmosphere of the rapid thermal anneal (RTA) system during the annealing of the PZT by passing oxygen ($O_2$) through a double bubbler containing purified deionized (DI) water, so that the oxygen was saturated with water vapour, e.g. using a gas flow rate of about 2 L/min. Ozone is preferably added to the annealing atmosphere to speed oxidation.

Data shown in FIGS. 1 to 9 compare results of measurements of characteristics including dielectric constant, and dispersion up to microwave frequencies, film stress, and leakage current, for ferroelectric capacitor structures fabricated according to the embodiment, and are discussed below.

The effects of varying the composition of the annealing atmosphere and the anneal temperature on film stress and leakage current were investigated and results are reported in detail in copending patent application Ser. No. 08-348848, to Emesh, MacDonald and Chivukala which is incorporated herein by reference.

The presence of water vapour during annealing significantly reduced the film stress of the resulting ferroelectric layers relative to annealing in dry oxygen or dry ozone/oxygen mixtures. Nevertheless film stress values were still significantly higher than the stress levels typically found in bulk ceramic samples of PZT. Addition of ozone speeded up oxidation and allowed reduced anneal times to achieve low temperature crystallization. The combined effect of oxygen/ozone in the presence of water vapour was found to reduce significantly the temperature and time required for crystallization to occur, i.e. from above 650° C. in dry oxygen only, to about 450° C. in the presence of water vapour and ozone/oxygen. X-Ray diffraction studies confirmed that crystallization to a perovskite phase occurred at 450° C.

Grain sizes were measured by TEM analysis, and found to be less than 20 nm. The glancing angle x-ray diffraction measurements revealed that the bulk of the film had crystallized into a perovskite phase, and no residual pyrochlore phase was detected. The most significant observation was that, in particular, samples prepared according to the method described above showed improved characteristics at high frequencies, with <10% dispersion in the microwave region up to at least 10 GHz. In seeking to explain the superior functional characteristics at high frequency, for the PZT ferroelectric dielectric formed by the method described above, the effect many variables were considered. All samples having high frequency response were characterized by small, substantially uniform grain sizes below 200 Å (20 nm), typically in the range from 100 to 150 Å (10–15 nm). By comparison, it is known bulk PZT samples prepared by conventional methods for preparing bulk ceramics including sintering, provide relatively large grains of 10 to 15 $\mu m$. Consequently, it is believed that the key to high frequency response is reproducible, small grain size. While the superior high frequency response of the present samples, is yet not fully understood by the applicant, the effect of various other factors were considered.

PZT formed from several different precursor mixtures provided similar high frequency characteristics. The Zr:Ti composition of the sol-gel mixture was varied from 20:80 to 80:20, and annealing was carried out in the range from 500° C. to 650° C. The composition of the sol-gel mixture did not appear to influence the grain size significantly, and typically the preferred mixture was 60:40 ratio of zirconium to titanium. While low temperature annealling, by rapid thermal processing, at about 500° C. appeared to favour small grain size, grain sizes in the range of 10 nm to 15 nm were obtained by rapid thermal annealing (RTA) at temperatures as high as 650° C. No evidence was obtained to indicate that the grain growth was influenced significantly by doping of the PZT with dopants, including for example, lanthanum and niobium. It is noted that while RTA used for many process steps in semiconductor manufacturing, it not widely used for fabrication of ferroelectric materials, and experiments are in progress to assess the results of annealling by RTA relative to conventional furnace anneals.

In related work reported in the above mentioned copending patent application, the effect of the introduction of water vapor in the annealing ambient on the stress and crystallization kinetics was studied. The initial focus of this effort was a reduction of the crystallization temperature of the PZT from ~650° C. to <500° C. However, this led to the discovery that the presence of water vapour during annealing has a significant effect in reducing film stress. The introduction of water vapour by bubbling $O_2$ or an $O_2/O_3$ mixture through purified, de-ionized water into the rapid thermal anneal (RTA) system during the annealing of the PZT resulted in crystallization at about 450° C., with improved or comparable physical properties and electrical properties. In particular, annealing at low temperature 450°–500° C. in the presence of water vapour, as compared to the standard process in dry oxygen, resulted in a lower tensile stress ($2$–$3\times10^9$ dyne/cm$^2$) compared to the tensile stress values of $1$–$2\times10^{10}$ dyne/cm$^2$ that are seen in films annealed in dry oxygen ambient at $\geq 650°$ C. Generally, it is found to be advantageous if the film stress values be kept as low as possible in order to avoid the problems associated with the peeling of the films and adhesion to other materials. Nevertheless, it is believed that the film stress remains high relative to bulk samples. Differences in the thermal expansion coefficient of the ferroelectric dielectric film and the substrate contributes to the stress levels in thin films. No significant correlation was found between the high frequency response and the film stress in these samples.

As reported in the above mentioned, copending patent application, the dielectric constant of the ferroelectric material increased with the amount of ozone in the annealing atmosphere. Ozone concentrations in the range 0.5 to 12% were investigated. It is believed that ozone concentrations in the range up to about 20% may be beneficial for annealing of ferroelectric dielectric materials. However, annealing in higher ozone concentrations may be impractical for semiconductor processing, in view of safety concerns regarding toxicity and potential fire hazard of ozone at high concentrations, which require that unreacted ozone is destroyed before exhausting the annealing chamber to atmosphere.

Nevertheless, a rapid, low temperature method for the crystallization of ferroelectric materials such as PZT and doped PZT is provided. Furthermore, rapid, lower temperature processing is particularly advantageous in allowing ferroelectric materials to be integrated into a process flow with a restricted thermal budget.

Pre-conditioning of the underlying substrate surface, i.e. the electrode, for example, by preparing a platinum electrode by a low temperature 400° C., 90 second, pre-anneal in oxygen, or oxygen and ozone, was beneficial in improving the electrical properties of the ferroelectric materials deposited thereon. This pre-anneal step was beneficial in improving the adhesion and uniformity of the coating the precursor solution on the substrate. Alternatively, a wet oxidizing pre-treatment, e.g. a dip in a sulfuric acid/ hydrogen peroxide cleaning solution was also found to increase the coverage of the precursor solution. When the pre-treatment was omitted, the dielectric constant of the ferroelectric material was reduced significantly. Nevertheless, preconditioning of the electrode surface did not cause any significant changes in the functional characteristics (i.e. frequency response).

Crystallization at 450° C. enables the fabrication of ferroelectric capacitors to be accomplished at a temperature compatible to those used in other low temperature IC fabrication steps. The improved crystallization method produces materials with electrical properties comparable with, or better than, the corresponding materials annealed at a temperature above 650° in a dry oxygen ambient.

At present, the phenomena leading to improved properties of the materials annealed at low temperature in the presence of water vapour, or water vapour and ozone is not fully understood. However, it is believed that the reduction of stress and crystallization temperature in the presence of water vapour may occur for the reasons discussed below.

Film stress was significantly reduced in all samples annealed in the presence of water vapour. Consequently it is believed that the reduction in crystallization temperature to obtain good quality ferroelectric dielectric films is a combined effect of annealling in the presence of both ozone and water vapour. While stress reduction appeared to be associated with the presence of water vapour during annealing, it is believed that the change in stress may be instrumental in promoting crystallization of the ferroelectric phase at lower temperature in the presence of ozone.

The PZT thin film material had a dielectric constant of 500, and a dissipation factor of about 2%. The material showed no dielectric relaxation up to 10 GHz as shown by curve B in FIG. 1, which shows the variation of the parallel capacitance and dissipation as a function of frequency. Curve A shows comparative data for a prior art sample. Response was not measured above 10 GHz. The parallel capacitance was about 80 pF. The dielectric parameters show a small dispersion up to about 100 MHz beyond which a sharp increase in dissipation factor and roll off in capacitance was noted. Such characteristics could be due to a relaxation mechanism having origins from the bulk of the dielectric material. Nevertheless, the absence of bulk relaxation phenomena, a series resistance of 1 to 1.5 Ohms is enough to dominate at high frequencies giving rise to the observed characteristics. In order to determine the influence of bulk phenomena vs. series resistance, for comparison, the characteristics of a 1 nF capacitor $225\times225$ $\mu$m$^2$ were measured. If the bulk relaxation were contributing to the characteristics of FIG. 1, a similar relaxation should also occur in FIG. 2. However, as can be seen from FIG. 2, a roll off in capacitance and peaking of the dissipation factor, tan $\delta$, takes place at much lower frequency 1 MHz. Consequently, bulk relaxation phenomena are not contributing. The series resistance of 1 to 1.5 ohms has contributions from contact resistance, sheet resistance of metal and interfacial resistance. Thus it is important that the series resistance be reduced to acceptable values for high frequency capacitor applications, e.g. to a few milli-ohms at GHz frequencies.

Figure 1:
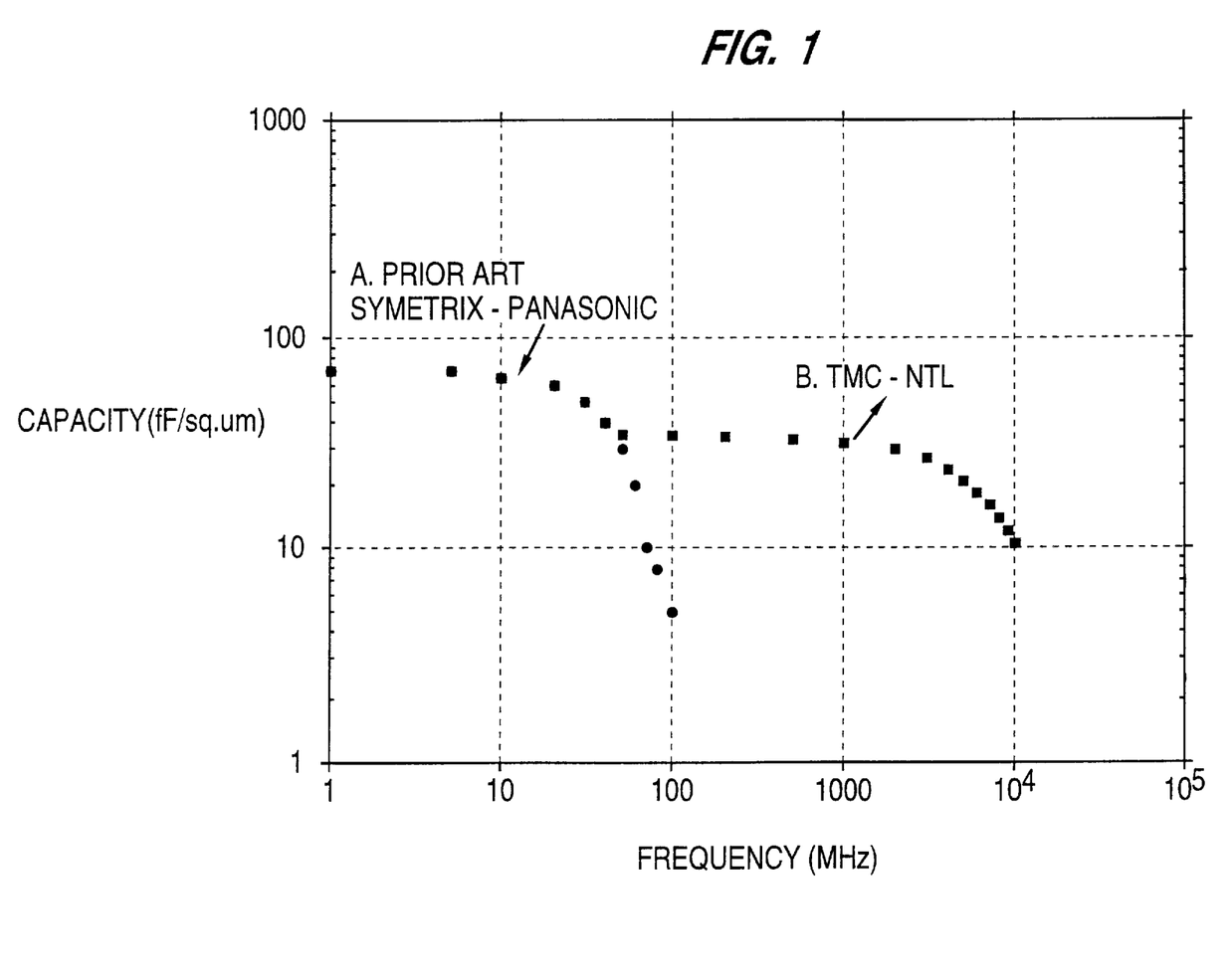
FIG. 1 shows a graph of the capacitance in $fF/\mu m^2$ for a samples of lead zirconate titanate prepared according to the first embodiment and a prior art sample of lead zirconate titanate, as a function of frequency.
Figure 2:
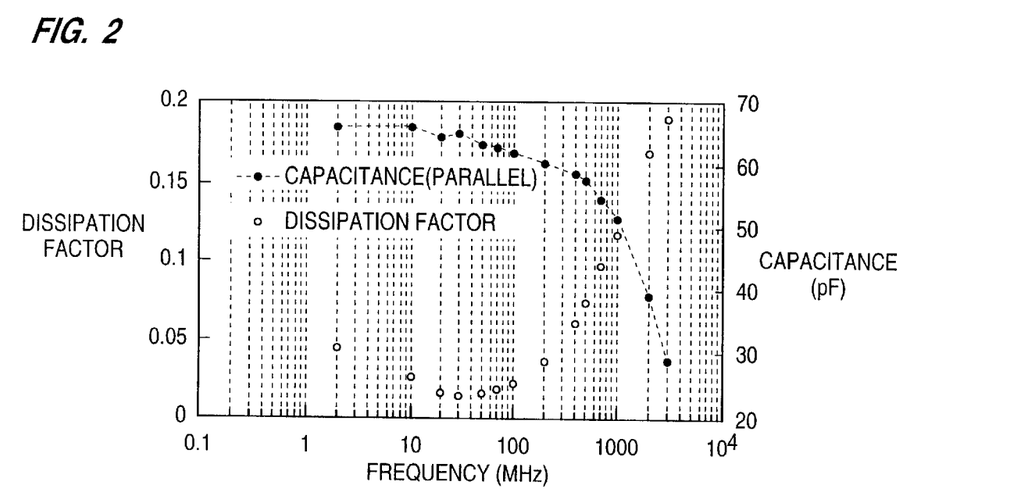
FIG. 2 shows dielectric dispersion data at high frequency >500 MHz for a capacitor of area 80×80 $\mu m^2$ formed according to a first embodiment.
Figure 3:
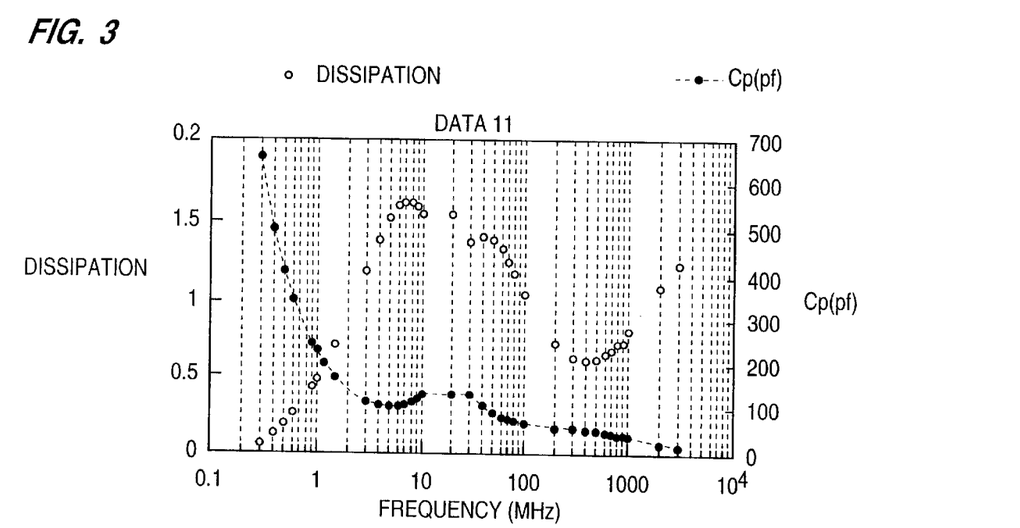
FIG. 3 shows dielectric dispersion data at high frequency >500 MHz for a capacitor of area 225×225 $\mu m^2$ formed according to a first embodiment.
Figure 4:
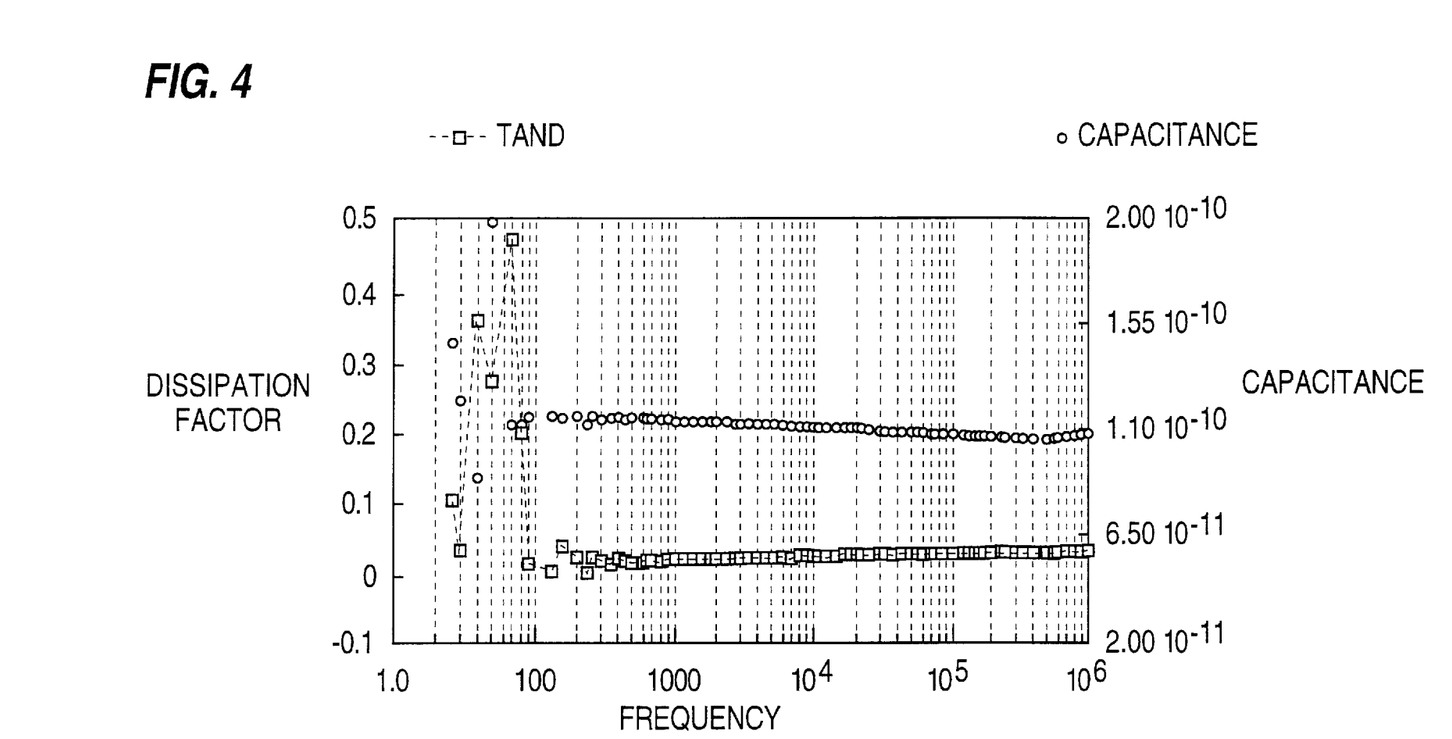
FIG. 4 shows the dielectric dispersion data for low to intermediate frequency <1 kHz to 1 MHz, for a capacitor formed according to a first embodiment.

At lower frequencies, as shown in FIG. 4, electrode polarization and related phenomena give rise to some spurious dispersion in dielectric characteristics, showing a large variation from sample to sample. Capacitors fabricated with platinum top electrodes patterned by a lift-off technique showed a stronger variation in dispersion (1 to 50%), compared with capacitors formed with evaporated gold electrodes, which showed only 1 to 3% dispersion. Consequently the electrode fabrication strongly affects dielectric dispersion characteristics in the low frequency region.

In the intermediate frequency region from about 1 kHz to 10 MHz, the dielectric dispersion is minimal, as shown in FIG. 4. An important requirement for high frequency operation is that the capacitor material should possess a dissipation factor low enough that the series equivalent resistance offered by the capacitor should be at most in the order of 10 milliohms. It is also important that the dielectric parameters do not show significant relaxation behaviour within the frequency of operation.

Figure 5:
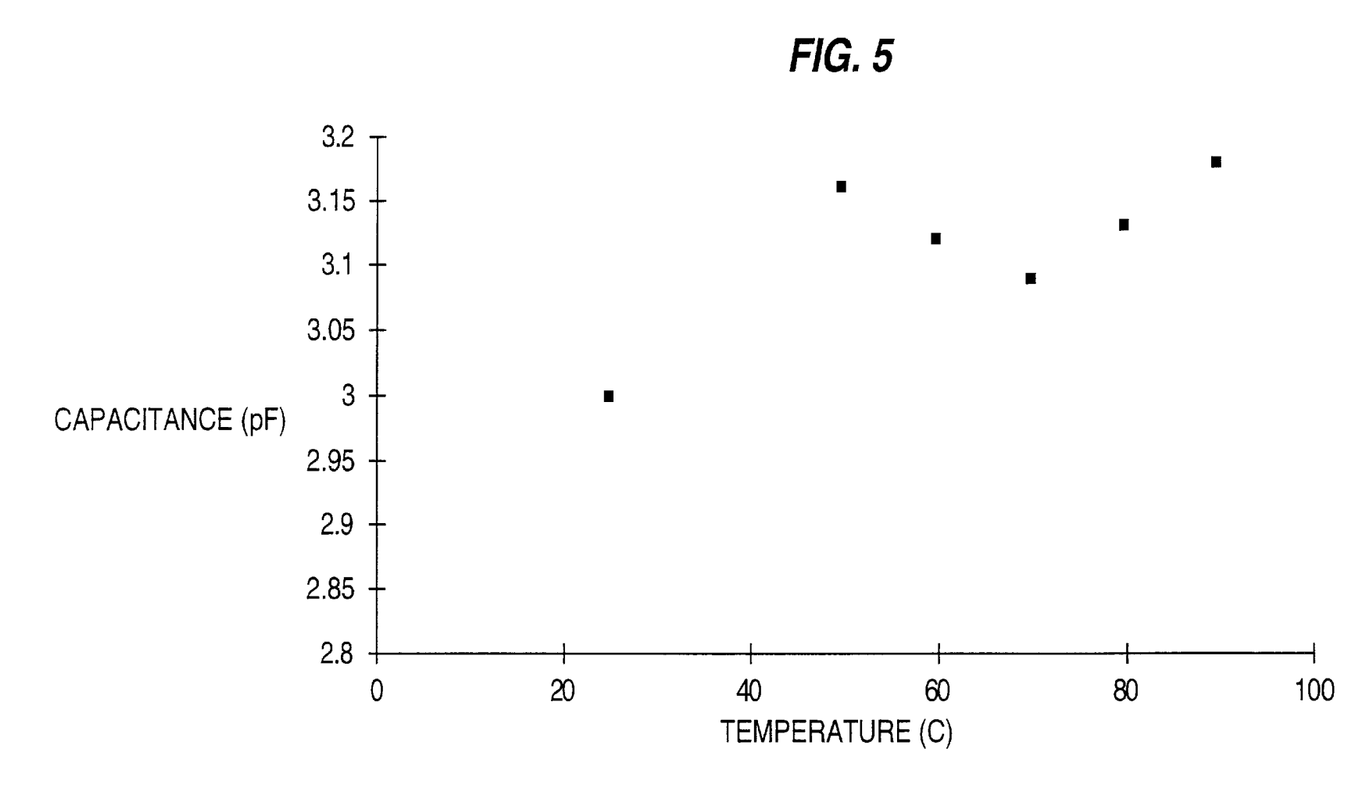
FIG. 5 shows the temperature dependence of the capacitance at 1 GHz.
Figure 6:
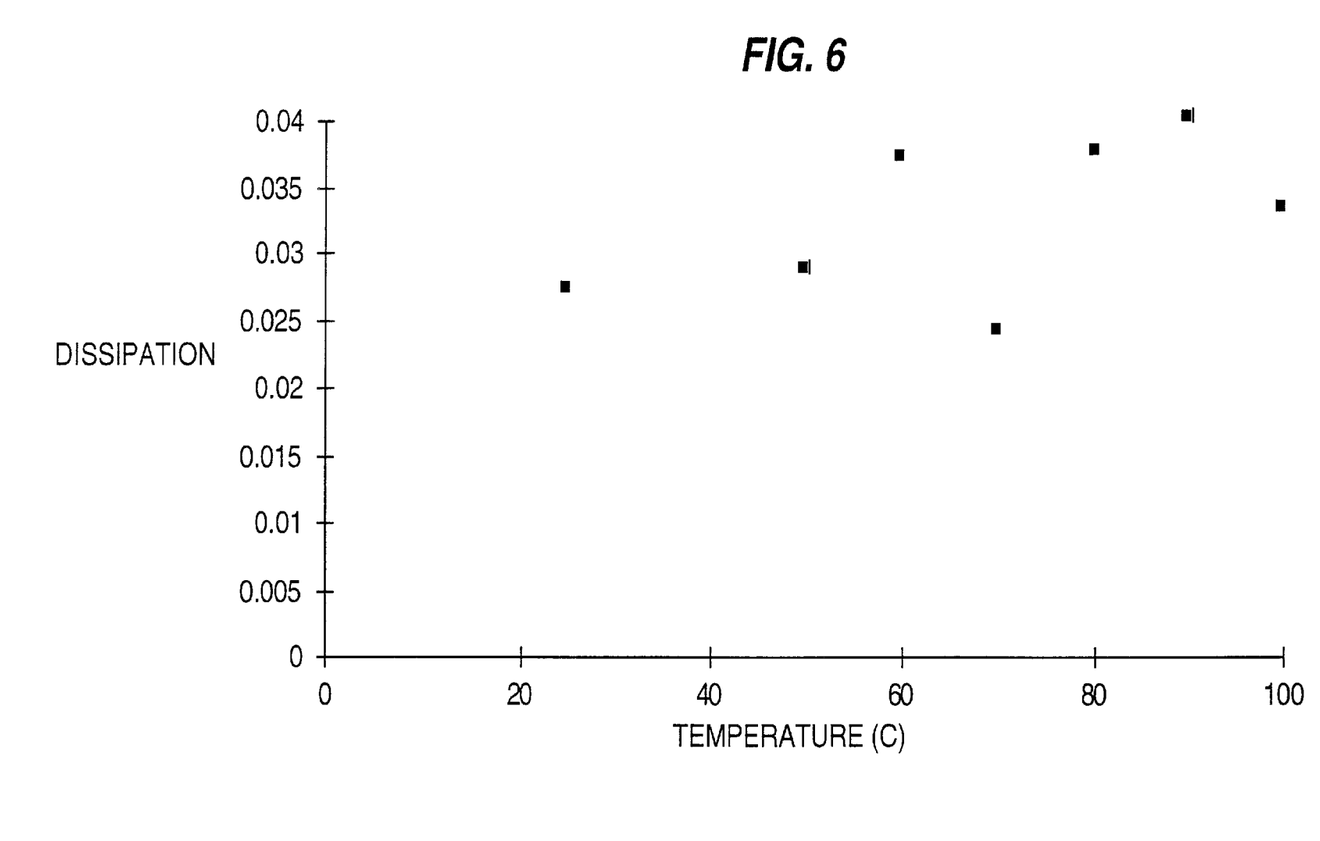
FIG. 6 shows the temperature dependence of dissipation factor D at 1 GHz.

FIG. 5 shows the variation in the capacitance with temperature at 1 GHz, and FIG. 6 shows the variation in the dissipation factor at 1 GHz. The variation of the measured capacitance value and dissipation factor, from approximately room temperature 25° C. to about 100° C. is within 10%. Similar results were obtained at 3 and 6 GHz.

Figure 7:
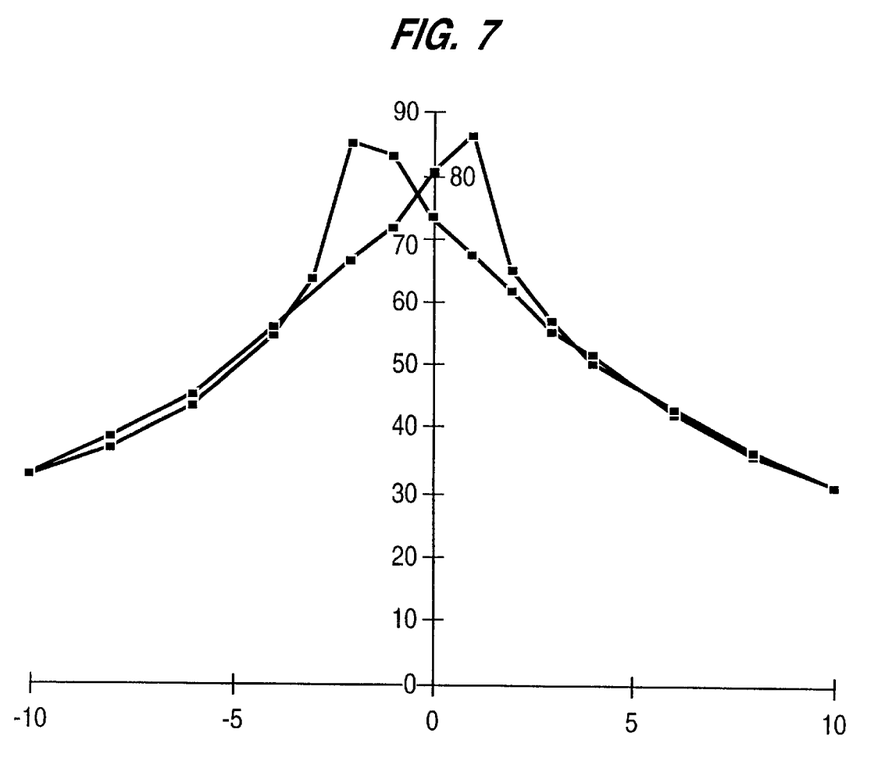
FIG. 7 shows the capacitance vs. voltage characteristics at 1 GHz.
Figure 8:
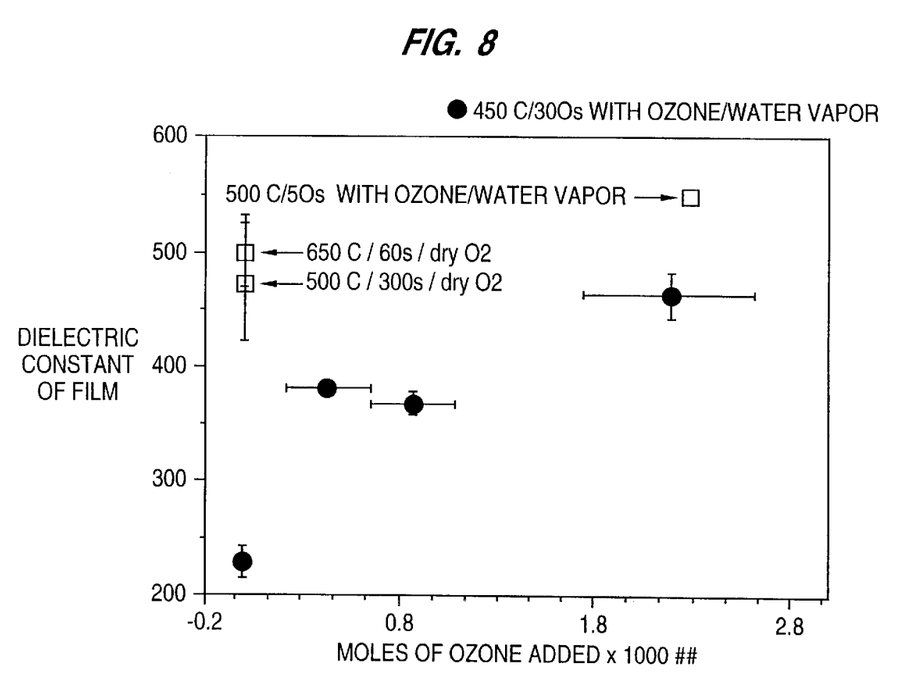
FIG. 8 shows a graph illustrating the dependence of the dielectric constant of PZT on the amount of ozone added to the annealing atmosphere for both wet and dry gas mixtures.
Figure 9:
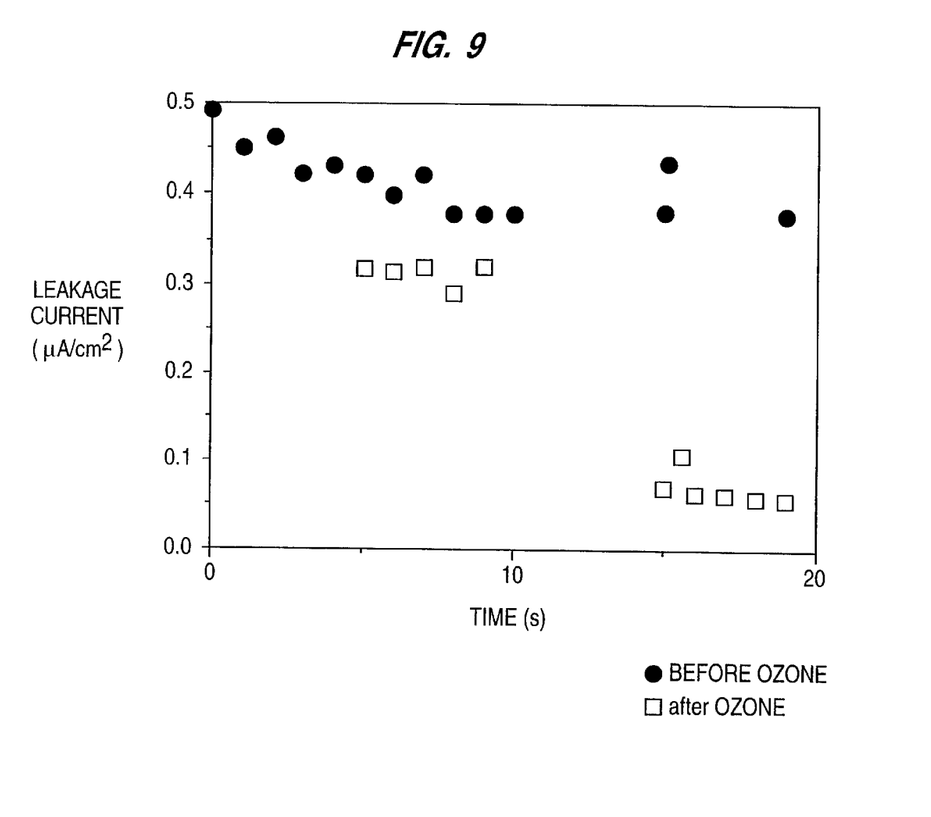
FIG. 9 shows a graph comparing the leakage current of ion milled ferroelectric dielectrics after a post-patterning anneal in oxygen with and without ozone.
Figure 10:
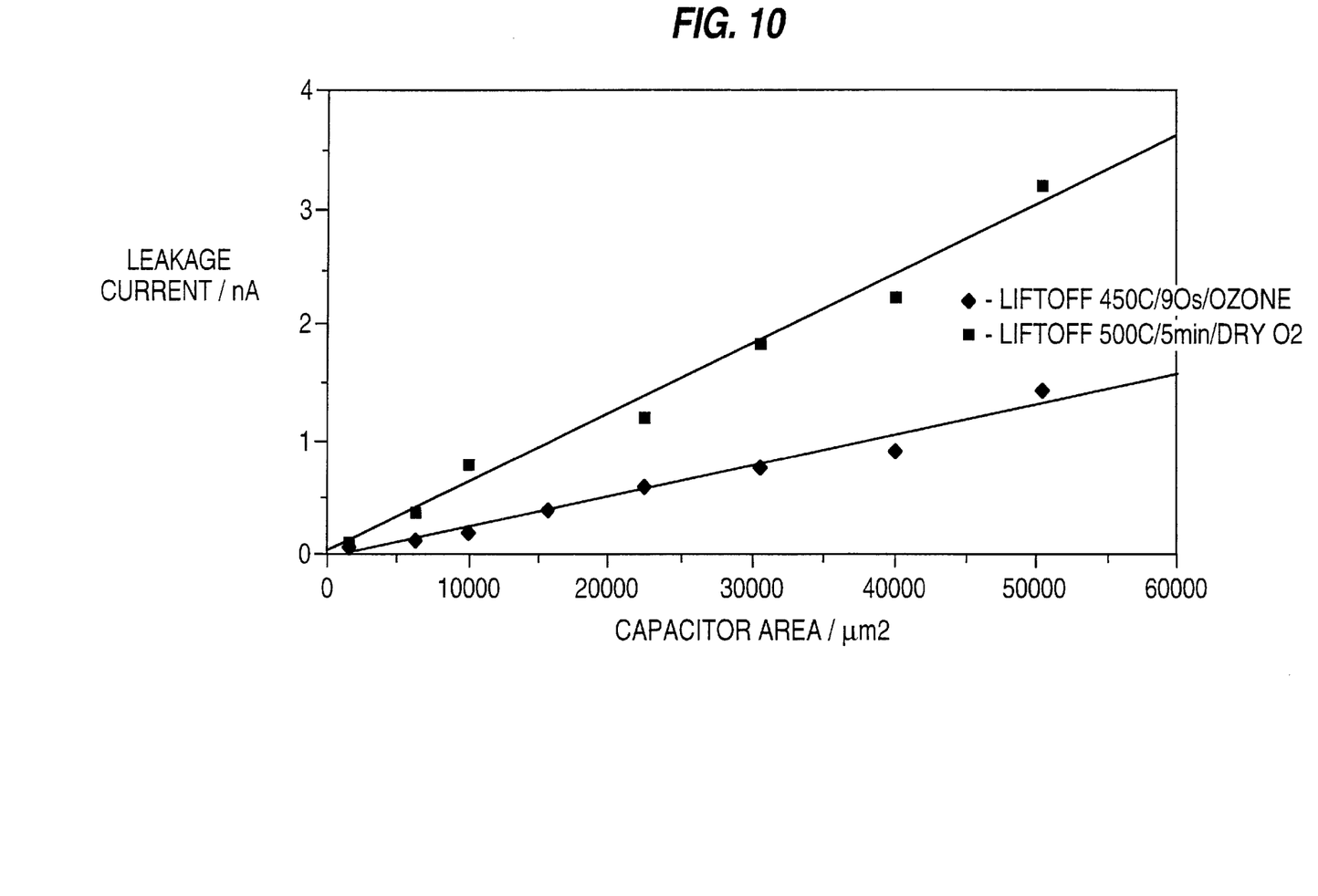
FIG. 10 shows a graph comparing the leakage current of capacitors, of different areas, fabricated by annealing in dry oxygen according to a conventional process and by annealing in oxygen/ozone and water vapour according to the method of the embodiment.

FIG. 7 shows the capacitance vs. voltage characteristics at 1 GHz. The "butterfly" loops of these curves confirm the ferroelectric nature of the films at 1 GHz.

In the present samples, the superior dielectric dispersion behaviour is believed to be influenced primarily by the smaller grain size associated with the thin film PZT compared with bulk, thick films obtained by sintering at higher temperatures.

As discussed above, composition of the sol-gel mixture, purity of constituent chemicals, method of deposition, etc. are not influential on the high frequency response. However fine grained material seems to be required for high frequency response. It appears that thin films with small grains have dielectric constants below the value for bulk materials, however dispersion is shifted to higher frequencies, relative to bulk materials having much larger grain sizes, ~10 $\mu$m. The PZT samples described above having fine grains of <20 nm, provide high frequency response to 10 GHz. While the relationship between grain size and roll-off frequency has not been fully investigated for grain sizes above 20 nm, it is expected that grain sizes >20 nm, would also provided improved response at high frequencies >100 MHz relative to bulk material. While the upper limit to the useful grain size to obtain a roll off frequency above 1 GHz is likely to be less than 1 $\mu$m, substrate clamping in thin films, discussed below, may significantly affect the dielectric dispersion relative to bulk samples. In thin films, extra clamping effects from the substrate may extend the useful grain size to ~1 $\mu$m or beyond.

An early paper in Journal of Applied Physics, 34 (11) November 1963, by Gerson and Peterson, describes a very broad dispersion of the dielectric constant of lead titanate zirconate ceramics at high frequency of about 1 GHz. Poled samples, i.e. electrically oriented samples, show less dispersion at high frequencies. Two mechanisms were proposed to the observed effect, inertial clamping of the piezoelectric response of the ferroelectric domains, and clamping of domain wall motion. A strongly polarized piezoelectric ceramic always has a dielectric dispersion region (usually a series of electrical resonances) in the frequency range of its mechanical body resonances (i.e. lattice vibrations). Since the particle radiating energy is loaded mechanically by surrounding material of the same properties, the dimension of the active radiating unit is probably somewhat smaller than 1 $\mu$m. This dimension agrees well with the domain sizes revealed by electron microscopy in these ceramics. These authors thus suggested that if the dispersion is centred around 2 GHz, the figure seems plausible from the flatness of the loss characteristic at this frequency; this frequency corresponds to resonance of a particle with linear dimension of 1 $\mu$m.

Consequently, the current results with PZT provides confirmation that the high frequency roll-off moves to higher frequency with smaller grain size. It is further significant that, below a certain grain size, each grain would comprise only one domain, i.e. below a critical grain size domain walls do not exist. This effect may influence the relative alignment of domains in neighbouring grains.

Although film stress is reduced by annealling in water vapour, stress levels are still high relative to bulk samples. The films examined were from about 50 nm to several microns thick, and thus were at least several grains in thickness. Consequently, it would be expected that there would be significant clamping effects as discussed for example in a theoretical study described in an article by G. Arlt in J. Appl. Physics 74(6), September 1993 entitled "Forced translational vibrations of 90° domain walls and the dielectric dispersion in ferroelectric ceramics". In an experimental study, the same author in "Twinning in ferroelectric and ferroelastic ceramics: stress relief", in J. Materials Science (1990) p.p. 2655–2666, showed that the domain width is general smaller in comparison with the grain size. Arlt also discussed how grain size influences the domain structure, and hence the dielectric dispersion of ferroelectric materials, but noted that the domain patterns of barium titanate and other perovskites were not well known.

Under conditions used to prepare films described above, grain growth above 20 nm was not observed. By comparison, the grain size in bulk ceramics is typically much larger, ~10 $\mu$m. The latter of the above mention two references by Arlt shows grains sizes of ~10 $\mu$m in a bulk sample of sintered PZT.

However, the present inventors are not aware of studies detailing how grain size can be controlled in fabrication of thin films of PZT or any published data showing the correlation between grain size, domain and functional properties of PZT or doped PZT at microwave frequencies up to 10 GHz.

Other Measurements

The results presented above for annealing in the presence of water vapour, suggest that a reduction in tensile stress may be influential in favouring crystallization to the perovskite phase at a lower temperature.

The dielectric constant of PZT (40:60 Zr/Ti) films annealed by rapid thermal processing at 650° C. in dry oxygen was in the range from 500 to 550. Samples annealed in dry oxygen at 450° C. had dielectric constants ~200 to 225. Other samples annealed at between 450° C. in a mixture of oxygen/ozone and water vapour showed an increased in dielectric constant dependent on the amount of ozone in the annealing atmosphere. A sample annealed at 450° C. in wet oxygen had a dielectric constant of 400. The sample annealed at 450° C. in wet oxygen and the highest concentration of ozone had a dielectric constant near to 500 comparable with samples dry annealed at higher temperatures. Increasing the anneal temperature to 500° C. using wet oxygen and the same amount of ozone increases the dielectric constant to 550.

The steady state leakage of a standard dry annealed PZT dielectric is about 60 nA/sq.cm, which is higher than the water vapor annealed PZT with 2 nA/sq.cm. The remanent polarization values are lower in case of water vapor annealed samples (90 fC/$\mu$m$^2$) compared to the dry process PZT (170 fC/$\mu$m$^2$). On the other hand, the fatigue characteristics of the remanent polarization are improved in water vapor annealed samples. In the dry annealed samples, the polarization decays to 30% of the initial value after $10^{11}$ cycles of fatigue, whereas the polarization of water vapor annealed samples decays only to 80% of the initial value.

In another set of PZT samples prepared under different conditions, the effect of annealing in wet and dry oxygen, with and without ozone were compared. A bottom electrode comprising 2000 Å platinum was deposited, followed by a blanket layer of 1800 Å PZT, and a top electrode comprising 1000 Å platinum patterned by a lift off technique. The PZT was deposited by two coatings, each of which were annealed for 90 seconds at 450° C., followed by a third coating and an final anneal at 450° C. for 5 minutes. Dielectric constants were measured as shown in Table I.

Thus annealing in wet oxygen improved the dielectric constant over annealing in dry oxygen. However annealling in wet oxygen with 1% ozone improved the dielectric constant to >300. The latter value is high enough for many applications. The samples annealed in dry oxygen with ozone had a significantly lower dielectric constant than other samples.

TABLE I

| anneal ambient | 80μm × 80μm capacitors | | 255μm × 225μm capacitors | |
|---|---|---|---|---|
| | dielectric constant | dissipation | dielectric constant | dissipation |
| dry oxygen | 225 ± 17 | 0.020 ± 0.005 | 219 ± 14 | 0.019 ± 0.001 |
| wet oxygen | 247 ± 5 | 0.021 ± 0.003 | 236 ± 2 | 0.019 ± 0.001 |
| dry 1% ozone in oxygen | 199 ± 18 | 0.022 ± 0.002 | 180 ± 6 | 0.023 ± 0.001 |
| wet 1% ozone in oxygen | 314 ± 7 | 0.014 ± 0.001 | 305 ± 3 | 0.016 ± 0.001 |

For comparison, ferroelectric capacitors structures were formed by deposition of a bottom electrode, a ferroelectric dielectric layer, and a top electrode and then patterned by 3 different methods: ion milling; chemically assisted reactive ion etch; and a lift-off technique. The latter process avoids exposure to ion bombardment and radiation damage. Leakage currents were 10 times higher for reactive ion etched samples relative to lift-off patterned samples, and ion milled samples had very high leakage currents, ~1000 times higher. Post-processing annealing in oxygen reduced leakage currents, from 5 to 10%; annealing in wet oxygen/ozone mixtures reduced the leakage currents by 70% for RIE samples, and by up to 95% for ion milled samples. The oxygen/ozone anneal also made more minor improvements to other properties of the ferroelectric material.

Thus, not only does the $O_2/O_3$ anneal in the presence of water vapour reduce the crystallization temperature to below 500° C., typically 450°–475° C. for PZT and PLZT, the stress and leakage current are reduced and fatigue behaviour is improved.

In a method of forming a capacitor structure comprising a ferroelectric dielectric formed according to an embodiment of the invention, since the ferroelectric dielectric may be fabricated at a temperature below 500° C., the ferroelectric layer may be placed on top of the first level metallization, which may comprise a low melting point alloy, e.g. an aluminium alloy. For example, the capacitor may be formed between metal 1 and metal 2 of a multilevel metal interconnect scheme. Thus in providing an integrated circuit on a conventional semiconductor substrate i.e. a semiconductor silicon wafer, active device structures are fabricated on the substrate by a known method and may comprising e.g. bipolar and CMOS transistors, diodes, memory cells, etc. as is conventional in an integrated circuit. An overlying layer of isolation is formed thereon. After forming contacts to the underlying devices, a first level of metal interconnect material is deposited thereon, and patterned to define interconnections as required. A first intermetal dielectric layer, i.e. an oxide, is deposited over metal 1 to isolate metal 1 and form a planarized substrate for subsequent layers. A barrier layer is deposited overall. After opening vias through the barrier layer and the underlying dielectric layer for contacting the metal 1 interconnects, another conductive layer is deposited and patterned to define a bottom electrode of the capacitor. The conductive layer typically comprises a metal alloy but alternatively comprises a conductive metal oxide. A layer of ferroelectric capacitor dielectric is deposited on the bottom electrode by the method described above, using a low temperature process, and the ferroelectric layer is patterned.

When patterning is by ion milling or reactive ion etching, a post patterning anneal in an oxygen/ozone containing atmosphere in the presence of water, as described above, is beneficial to the electrical properties of the ferroelectric dielectric layer. Another conductive layer is deposited thereon to form the top electrode. The structure is encapsulated in a capping layer, which functions as a diffusion barrier. Subsequent layers comprising dielectric and interconnect metallization are then completed in a conventional manner.

Thus, an improved process for ferroelectric crystallization at low temperature was obtained using low concentrations of ozone when annealing takes place in the presence of water vapour.

Ferroelectric layers doped, for example, with lanthanum or niobium also showed improved high frequency response. Other dopants such as Ta or Cr may replace Pb or Zr/Ti atoms may also be suitable as dielectrics for high frequency applications. While PZT is most commonly used undoped, doping modifies the leakage, improves linearity and increase ferroelectric characteristics.

It is also expected that fine grained antiferroelectric lead zironate (Ti=0) and fine grained ferroelectric lead titanate (Zr=0) would also show similar improved high frequency characteristics.

PZT has several advantages over BST as a ferroelectric dielectric for capacitors for integrated circuits, in that the process temperature is lower and the dielectric constant higher. Requirements for barrier layers, are similar for both materials.

Among other known techniques for depositing ferroelectric thin films are RF sputtering, electron beam evaporation, chemical vapour deposition and gas jet deposition. In recent years, chemical methods of depositing PZT and other ferroelectric films have become popular, for example a metallorganic decomposition (MOD) and sol-gel deposition. A sol-gel process provides for ease of preparation and fabrication, i.e. by a spin-on liquid process, at lower capital cost compared with low pressure vacuum techniques. Nevertheless, a sol-gel method can produce ferroelectric dielectric materials of high quality. It is believed other methods may be capable of producing small grain PZT suitable for high frequency applications.

Ferroelectric materials also have applications as piezoelectric materials for Surface Acoustic Wave (SAW)devices. A thin layer of ferroelectric fine grained PZT as described above may be used to fabricate high frequency surface acoustic wave devices, having low mechanical loss.

Thus, although particular embodiments of the invention have been described in detail, it should be appreciated that variations, modifications and adaptations may be made without departing from the scope of the invention as defined in the claims.

What is claimed is:

1. A ferroelectric dielectric for an integrated circuit operable at microwave frequencies comprising fine grained polycrystalline lead zirconate titanate characterized by a dielectric constant greater than 300 at frequencies above 1 GHz.

2. A dielectric according to claim 1 wherein the polycrystalline lead zirconate titanate is characterized by grain sizes below 20 nm.

3. A dielectric according to claim 1 wherein the polycrystalline lead zirconate titanate is characterized by grain sizes predominantly in the range 10 to 15 nm.

4. A dielectric according to claim 1 wherein the polycrystalline lead zirconate titanate is characterized by substantially uniform grain sizes below 20 nm and a dielectric constant greater than 300 at frequencies up to 10 GHz.

5. A dielectric according to claim 1 wherein the polycrystalline lead zirconate titanate comprises a dopant selected from the group consisting lanthanum, niobium, tantalum and chromium.

6. A ferroelectric capacitor for an integrated circuit operable at microwave frequencies comprising first and second electrodes and an intervening layer of a ferroelectric capacitor dielectric material, the capacitor dielectric material being selected from doped and undoped polycrystalline lead zirconate titanate, zirconium titanate, and lead titanate, the ferroelectric capacitor dielectric material being characterized by fine grain size and ferroelectric properties which are maintained at operating frequencies of the capacitor above 1 GHz.

7. A capacitor according to claim 6 wherein the dielectric material is polycrystalline lead zirconate titanate having grain sizes less than 20 nm.

8. A capacitor according to claim 6 wherein the dielectric material is polycrystalline lead zirconate titanate with grain sizes in the range 10 to 15 nm.

9. A high frequency surface acoustic wave device comprising a thin layer of fine grained polycrystalline ferroelectric lead zirconate titanate characterized by a dielectric constant greater than 300 at frequencies greater than 1 GHz and up to at least 10 GHz.

10. A ferroelectric capacitor for an integrated circuit operable at microwave frequencies and comprising first and second electrodes and an intervening layer of a ferroelectric capacitor dielectric material, the capacitor dielectric material being selected from doped and undoped polycrystalline lead zirconate titanate, zirconium titanate, and lead titanate, a dielectric constant of the ferroelectric capacitor dielectric material being greater than 300 for operating frequencies between 1 GHz and 10 GHz.

11. A ferroelectric dielectric for an integrated circuit operable at microwave frequencies comprising fine grained polycrystalline lead zirconate titanate characterized by a dielectric constant greater than 300 at frequencies above 1 GHz produced by a process comprising the steps:

depositing a layer of amorphous ferroelectric precursor material comprising a mixture of lead, zirconium and titanium compounds on an integrated circuit substrate, and annealing the layer of amorphous ferroelectric precursor material at a temperature sufficient to cause a phase transformation to a fine grained ferroelectric polycrystalline perovskite phase, the annealing step comprising heating in an oxygen containing atmosphere in the presence of water vapour to provide a ferroelectric layer of lead zirconate titanate.

* * * * *